United States Patent [19]
Bunshah et al.

[11] Patent Number: 5,494,558
[45] Date of Patent: Feb. 27, 1996

[54] PRODUCTION OF FULLERENES BY SPUTTERING

[75] Inventors: Rointan F. Bunshah, Playa del Rey; Shyankay Jou, Santa Monica; Shiva Prakash, Santa Barbara; Hans J. Doerr, Westlake Village, all of Calif.

[73] Assignee: The Regents of the University of California, Oakland, Calif.

[21] Appl. No.: 346,549

[22] Filed: Nov. 29, 1994

Related U.S. Application Data

[63] Continuation of Ser. No. 929,637, Aug. 12, 1992, abandoned.

[51] Int. Cl.$^6$ .................................................. C23C 14/34
[52] U.S. Cl. .................. 204/192.15; 204/192.12; 204/298.19
[58] Field of Search ...................... 423/445, 446, 423/461; 204/192.12, 192.15, 192.1, 298.01, 298.09, 298.19

[56] References Cited

U.S. PATENT DOCUMENTS

| | | | |
|---|---|---|---|
| 4,565,618 | 1/1986 | Banks | 204/192.11 X |
| 4,872,905 | 10/1989 | Bourne et al. | 204/192.12 X |
| 5,071,708 | 12/1991 | Komaki et al. | 423/446 X |

FOREIGN PATENT DOCUMENTS

WO92/04279  3/1992  WIPO .

*Primary Examiner*—Nam Nguyen
*Attorney, Agent, or Firm*—Poms, Smith, Lande & Rose

[57] ABSTRACT

A process and system for producing fullerenes by sputtering. A carbon target is sputtered to form a vapor of sputtered carbon atoms. The sputtered carbon atoms are quenched in an atmosphere of inert gas and deposited onto a collection substrate. The resulting carbon soot is extracted to recover fullerenes. The process produces carbon soot which is rich in $C_{70}$ and higher fullerenes.

14 Claims, 2 Drawing Sheets

PRODUCTION OF FULLERENES BY SPUTTERING

This is a continuation of application Ser. No. 08/929,637 filed on Aug. 12, 1992, abandoned.

BACKGROUND OF THE INVENTION

1. Field of the Invention

The present invention relates generally to processes and systems for producing fullerenes. More particularly, the present invention relates to the production of fullerenes utilizing the basic physical vapor deposition process commonly known as sputtering.

2. Description of Related Art

The publications and other reference materials referred to herein to describe the background of the invention and to provide additional details regarding its practice are hereby incorporated by reference. For convenience, the reference materials are numerically referenced and identified in the appended bibliography.

Fullerenes are cage-like molecules which constitute the third form of pure carbon. The other two pure forms of carbon are diamond and graphite. $C_{60}$ was one of the first fullerenes to be produced in gram quantities. The initial processes for producing $C_{60}$ involve the use of resistive (1, 2) or arc heating (3) of graphite. The availability of gram quantities of $C_{60}$ has lead to a period of intense ongoing research into the chemical, physical and material properties of this first molecular allotrope of carbon (4, 5).

More recently, many additional fullerenes have been isolated. $C_{70}$, $C_{76}$, $C_{78}$, $C_{84}$, $C_{90}$, $C_{94}$ and $C_{96}$ are just a few of the additional fullerenes which have been identified (6). These fullerenes have been commonly referred to as the "higher" fullerenes.

International Patent Application No. WO92/04279 published on Mar. 19, 1992, discloses an exemplary method for producing fullerenes. This method, like the above-described methods involves the resistive or arc heating of graphite in the presence of an inert quenching gas to form a black soot material which contains fullerenes. As set forth in this published patent application, $C_{60}$ is the predominant fullerene produced in the process where carbon is evaporated in the presence of an inert quenching gas. When the pressure of the inert gas is on the order of 100 Torr, the fullerene product isolated from the soot contains 60 to 70 weight % $C_{60}$, 20 to 30% $C_{70}$ and approximately 5 weight % of higher fullerenes in the range between $C_{76}$ and C96 (5- pp. 119–126).

Although the above procedures are capable of producing relatively large amounts of $C_{60}$ and $C_{70}$, the isolation of higher fullerenes, e.g. $C_{76}$, $C_{78}$ and $C_{78}$ from these mixtures is tedious and yields only limited amounts of pure materials. Since investigations now show that the chemistry of higher fullerenes promises to be diverse and distinctly different from the chemistry of $C_{60}$ and $C_{70}$, it would be desirable to provide processes and systems for preparing the higher fullerenes in larger quantities (7).

Laser vaporization of a rotating graphite target in a tube furnace (5- pp. 98–105) and inductive heating of graphite powder (8) have also been used in fullerene production processes. Both of these vaporization methods also yield soot in which $C_{60}$ is by far the predominant product. Also, $C_{60}$ and $C_{70}$ have been isolated from the soot produced in oxidizing benzene flames. Depending upon the conditions, variations of the $C_{70}/C_{60}$ ratio range from about 0.26 to 5.27 (9).

In view of the continuing significant interest in fullerenes, there is a continuing need to provide processes and systems for producing a variety of fullerenes in useful amounts which can be used for further study and evaluation. Further, there is a need to provide processes and systems which are capable of producing fullerene mixtures which are especially rich in the higher fullerenes, i.e. $C_{76}$–$C_{96}$.

SUMMARY OF THE INVENTION

In accordance with the present invention, a process and system are provided for preferentially producing $C_{70}$ and the higher fullerenes with only minor amounts of $C_{60}$ being produced. The present invention is based upon the discovery that sputtering of a carbon target in the presence of an inert quenching gas produces soot which is especially rich in $C_{70}$ and other high fullerenes. In the process of the present invention, fullerenes are produced by bombarding a carbon target with a sufficient amount of positive ions to sputter carbon atoms from the target. The sputtered carbon atoms interact with an atmosphere of inert gas to form a carbon soot which is deposited on substrate surfaces located near the carbon target and on the reactor walls. Extraction of the soot with non-polar solvents results in the recovery of a mixture of fullerenes which is consistently rich in $C_{70}$ and the higher fullerenes with only minor amounts of $C_{60}$ being present.

As a feature of the present invention, the well known principles of sputtering are applied to atomizing graphite or other suitable carbon targets to form a vapor of sputtered carbon atoms which, when quenched with an inert gas, forms a soot that contains relatively large amounts of fullerenes. Sputtering of the carbon target is a significant departure from the conventional resistive or arc heating used in prior processes to vaporize graphite targets. In accordance with the present invention, it was discovered that sputtering of a carbon target in the presence of an inert gas atmosphere not only produced appreciable amounts of fullerenes, but that the soot is especially rich in $C_{70}$ and the higher fullerenes.

As a feature of the present invention, soot collected from different portions of the reactor walls and from different substrates located at different positions with respect to the carbon target contain differing amounts of $C_{70}$ and the higher fullerenes. In all cases, however, only a minor amount of $C_{60}$ is present. This feature provides the ability to selectively emphasize the production of certain higher fullerenes by isolating and extracting soot from different locations in the sputtering vessel.

The process and system in accordance with the present invention provides an important alternative to prior procedures which are based upon evaporation of carbon by electrical resistance or thermal heating. In addition, the present invention provides for the recovery of relatively large amounts of $C_{70}$ and the higher fullerenes.

The above-described and many other features and attendant advantages of the present invention will become better understood by reference to the following description of the preferred embodiments, when taken in conjunction with the accompanying drawings.

DESCRIPTION OF THE PREFERRED EMBODIMENTS

The present invention involves the production of fullerenes by subjecting a carbon target to sputtering in the presence of an atmosphere of inert gas. Carbon soot produced from the sputtered carbon is recovered from substrate and reactor surfaces and treated in accordance with known extraction procedures to recover fullerenes.

Sputtering of a wide variety of materials is well known and has been widely practiced in connection with the deposition of thin films (10, 11). In accordance with the present invention, it was discovered that conventional sputtering techniques, when applied to a suitable carbon target, can be effective in producing carbon soot which contains fullerenes. Further, it was discovered that the fullerenes present in the carbon soot produced by sputtering are especially rich in the higher fullerenes, i.e. $C_{70}$, $C_{76}$, $C_{78}$ and $C_{84}$.

Figure 1:
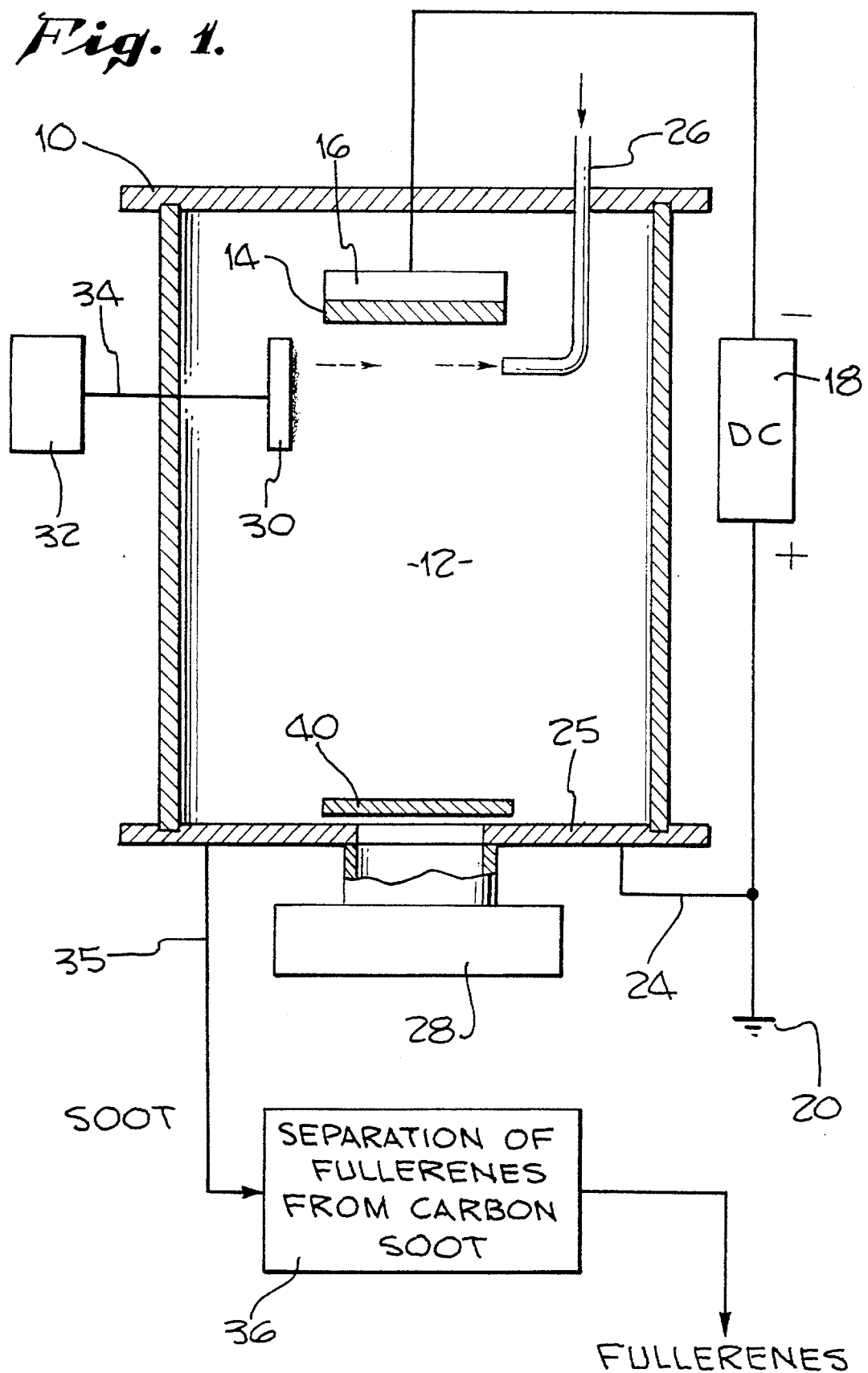
FIG. 1 is a schematic representation of a preferred exemplary system in accordance with the present invention for producing fullerenes by sputtering of a carbon target in the presence of an inert quenching gas.

FIG. 1 is a schematic representation of a preferred exemplary system for conducting fullerene production in accordance with the present invention. The system is a conventional sputtering system which includes a number of modifications to provide production of soot which contains fullerenes. The system includes a sputtering vessel 10 which provides a sputtering zone 12. The carbon target to be sputtered 14 is mounted on a sputtering cathode 16. The sputtering cathode 16 is connected to a power supply 18. The power supply 18 grounded at 20 by way of line 22. The vessel 10 includes a grounding plate 25 which is grounded through line 24. The grounding plate 25 is located a selected distance from the sputtering cathode 16. As is well-known in the art, the distance between the sputtering cathode 16 and grounding plate 25 may be varied depending upon power applied to the circuit and a number of other parameters. The power supply 18 can be any of the conventional power supplies typically used in powering sputtering cathodes used in thin layer deposition processes. The power supply 18 should be able to provide target circuit power of up to about 2.5K Watt or higher.

The carbon target 14 is preferably graphite. However, other forms of carbon may be used including amorphous carbon, pyrolytic carbon and any other form of carbon which produces fullerenes when sputtered in the presence of an inert quenching atmosphere. It is preferred that the carbon target be sputtered utilizing a magnetron sputtering cathode wherein the magnetic field confines the electrons in the vicinity of the target. However, if desired, other sputtering procedures may be utilized. Suitable alternative sputtering procedures include diode sputtering. The carbon target is preferably a disk. However, various other target shapes may be utilized in accordance with known sputtering procedures.

In accordance with the present invention, an atmosphere of inert quenching gas is maintained in the sputtering zone 12. The inert gas is preferably helium, but may be any of the other known inert gases, such as argon or other gas commonly employed to provide a non-reactive atmosphere. The following description will be limited to using helium as the inert quenching gas, with it being understood by those skilled in the art that any other suitable inert gas may be used.

The helium is introduced into the sputtering zone through inlet nozzle 26. A vacuum pump 28 is provided for maintaining the pressure within the sputtering zone 12 at desired levels. The vacuum pump 28 and helium flow rate is controlled so that the helium atmosphere is maintained at between about 0.5 Torr and 10 Torr. At pressures of 1 to 2 Torr, the ratio of $C_{70}$ to $C_{60}$ is high. This ratio decreases as the helium pressure is increased. At 10 Torr, the ratio of $C_{70}$ to $C_{60}$ is about 1 to 1. The preferred pressure range is 1 to 3 Torr. This range of pressure is preferred to provide optimum production of the higher fullerenes.

The magnetron sputtering cathode is preferably powered at levels of between about 1 to 10K Watt in order to set up a discharge between the cathode 16 and ground plate 25 so that helium ions bombard the carbon target 14 in sufficient numbers and with sufficient energy to sputter carbon atoms from the target 14 to form a vapor of sputtered atoms. The vapor of sputtered atoms is primarily located in the vicinity of the target 14. However, certain amounts of the vapor may travel through the sputtering zone 12 and deposit on the walls of the sputtering vessel 10.

In order to maximize localized deposition of the sputtered carbon atoms, it is preferred that the helium be introduced through line 26 as a stream which entrains the sputtered carbon atoms and deposits them preferentially on substrate 30. If desired, a number of substrates may be located at spaced locations within the sputtering zone 12, the substrate 30 and any other additional substrates are preferably chilled to temperatures below 25° C. and preferably at the temperature of liquid nitrogen. A reservoir 32 of liquid nitrogen is provided which is introduced through line 34 into suitable cooling ducts present in substrate 30 to maintain the substrate at the extremely cold temperature of liquid nitrogen. Other cooling apparatus may be used and various cooling temperatures may be maintained in order to obtain different soot compositions and deposition rates. The substrates on which the soot is deposited can be made from a variety of material including copper and similar metals.

The carbon soot which is deposited on substrate 30 is removed from the vessel 10 as represented by arrow 34 and subjected to extraction with non-polar solvents to recover fullerenes from the soot. Extraction of the fullerenes from the carbon soot can be accomplished using any of the known non-polar solvents in which fullerenes are soluble. Suitable non-polar solvents include pentane, hexane, heptane, octane, benzene, alkyl-benzenes including toluene and xylene, carbon disulfide, carbon tetrachloride, pyridine, quinoline and trichloroethane. Hot toluene is the preferred solvent. The hot toluene is preferably used at temperatures at or near its boiling point.

The particular extraction procedure used to separate the fullerenes from the non-fullerene soot material can include any combination of extraction and/or separation procedures. Preferably, the soot is exposed to the non-polar solvent for a sufficient time to remove substantially all of the fullerenes from the soot into the solvent. The fullerenes can then be separated from other soluble components in the extract by conventional separation procedures such as chromatography. The extraction and separation is preferably conducted outside the sputtering vessel 10 as represented by box 36. The fullerenes separated from the soot can be left as a mixture of higher fullerenes or can be separated by chromatography into various fractions of individual fullerenes.

Examples of practice are as follows:

The system shown in FIG. 1 was utilized to produce fullerenes by magnetron sputtering of a 7.6 centimeter diameter graphite target disk. The graphite target disk was 0.5 centimeter thick. The graphite target was attached to the magnetron sputtering cathode. A circuit power of 2.5K Watt was applied between the magnetron sputtering cathode 16 and the grounding plate 25. The grounding plate 25 was located 36 centimeters away from the magnetron sputtering cathode 16. The target circuit power of 2.5 kilowatts was sufficient to sputter carbon atoms from the graphite target by bombardment with positive helium ions from the surrounding atmosphere. The helium ions were generated from the discharge between the cathode target assembly 16 and the ground plate 25. A lateral flow of helium was introduced through line 26. The gas flow of helium through line 26 and vacuum pump 28 where adjusted to maintain a helium pressure of 3 Torr in the sputtering vessel 10. The sputtering vessel utilized was a conventional glass bell jar. The lateral flow of helium provided quenching of the sputtered carbon atoms to form a carbon soot. The soot was pushed by the helium towards the liquid nitrogen cooled substrate 30. The substrate 30 was a copper plate having the dimensions 12 cm×16.5 cm×0.1 cm. The substrate surface was located about 7 cm from the target.

The sputtering process was carried out for approximately 15 minutes and produced 470 mg/KW hour of soot. The majority of the soot was collected on substrate 30; however, some carbon soot also collected on the bell jar which was maintained at room temperature. A cover plate 40 was placed over the vacuum pump 28 in order to prevent the loss of gaseous fullerenes or other carbon species. The plate 40 was made from stainless steel. During the sputtering process, a strong glow from the ground plate 25 to the graphite target 14 was visible. However, no high-current arcing occurred as no reduction in the power supplied to the target was observed.

Figure 2:
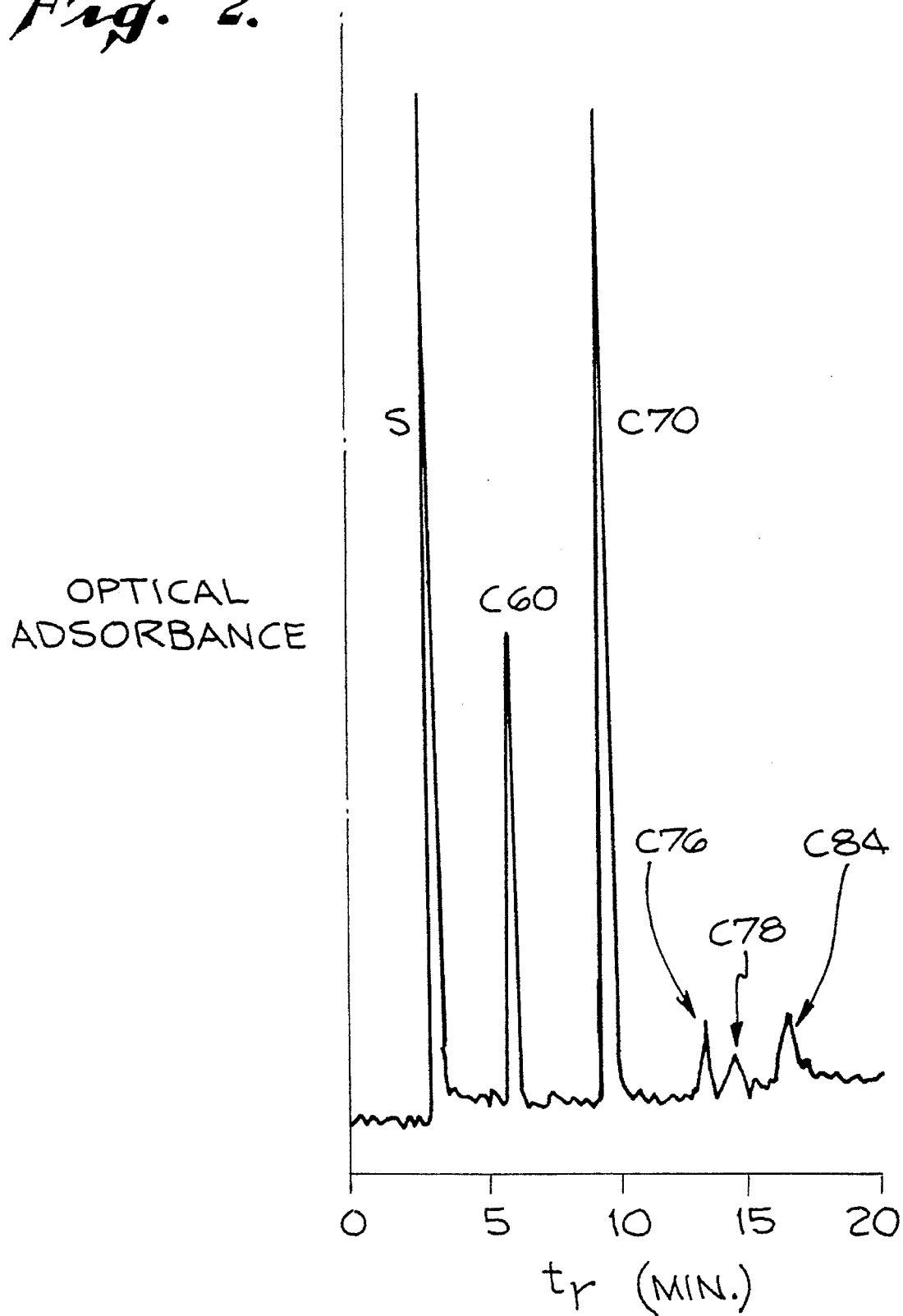
FIG. 2 depicts the results of high performance liquid chromatography (HPLC) separation of fullerenes in an extract sample taken from carbon soot produced by sputtering in accordance with the present invention.

The carbon soot collected from the substrate 30 was extracted with hot toluene and filtered through a plug of cotton to remove particulate matter. The extract was concentrated by rotary evaporation. HPLC analysis was performed using a Vydac $C_{18}$ reversed-phase column using toluene: acetone nitrile (1:1, V/V) as the eluant (5). As can be seen from FIG. 2, the eluant contained a predominance of $C_{70}$. In addition to $C_{70}$, a significant amount of higher fullerenes was also isolated. In additional production runs, the quantity of the soluble higher fullerenes in the range between $C_{76}$ and $C_{84}$ was equal to or exceeded the amount of $C_{60}$ formed. The identity of the fullerenes was confirmed by HPLC comparisons with pure standards and by laser desorption time-of-flight (LD-TOF) mass spectrometry. The yield of fullerenes in the soot produced by sputtering was approximately 0.5%. The yield may be increased by changing the various parameters, such as sputtering power, helium atmosphere concentration, location of substrate surfaces and the like. Accordingly, optimization of fullerene production can be further achieved by routine experimentation with different process variables.

Additional examples of practice are as follows:

The sputtering process is conducted in the same manner as the preceding example except that the helium gas stream is cooled to the temperature of liquid nitrogen prior to being introduced into contact with the sputtered carbon atoms.

In a further example, the process of the first example is carried out except that the quenching gas is a mixture of argon and helium. The ration of argon to helium is about 1:3.

In another example, the process described in the first example is carried out except that diode sputtering is used instead of magnetron sputtering to provide sputtering of the graphite target. In a final example, the process of the first example is carried out except that the substrate surface is located at various different distances from the target and placed at various different locations in the sputtering zone. The orientation of the substrate surface with respect to the target is also varied. In addition, various substrate shapes and configurations can be used.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

BIBLIOGRAPHY

1. Kratschmer, W.; Lamb, L. D.; Fostiropoulos, K.; Huffman, D. R. *Nature* 1990, 347, 354.
2. Ajie, H.; Alvarez, M. M.; Anz, S. J.; Beck, R. D.; Diederich, F.; Fostiropoulos, K.; Huffman, D. R.; Kratschmer, W.; Rubin, Y.; Schriver, K. E.; Sensharma, D.; Whetten, R. L. *J. Phys. Chem.* 1990, 94, 8630.
3. Haufler, R. E.; Conceicao, J.; Chibante, L. P. F.; Chai, Y.; Byrne, N. E.; Flanagan, S.; Haley, M. M.; O'Brien, S. C.; Pan, C.; Xiao, Z.; Billups, W. E.; Ciufolini, M. A.; Hauge, R. H.; Margrave, J. L.; Wilson, L. J.; Curl, R. F.; Smalley, R. E. *J. Phys. Chem.* 1990, 94, 8634.
4. Kroto, H. W.; Allaf, A. W.; Balm, S. P. *Chem. Rev.* 1991, 91, 1213.
5. The March 1992 issue of *Acc. Chem. Res.* (1992, 25, 97–175) is entirely dedicated to fullerene research and describes the chemistry and physics of these new carbon allotropes in eleven review articles written by various authors.
6. Diederich, F.; Ettl, R.; Rubin, Y.; Whetten, R. L.; Beck, R.; Alvarez, M.; Anz, S.; Sensharma, D.; Wudl, F.; Khemani, K. C.; and Kock, A. *Science* Vol. 252, pp. 548–551 (26 Apr. 1991)
7. Li, Q.; Wudl, F.; Thilgen, C.; Whetten, R. L.; Diederich, F. *J. Am. Chem. Soc.* 1992, 114, 3994.
8. Peters, G.; Jansen M. *Angew. Chem.* 1992, 104, 240; *Angew. Chem. Int. Ed. Engl.* 1992, 31, 223.
9. Howard, J. B.; McKinnon, J. T.; Makarovsky, Y.; Lafleur, A. L.; Johnson, M. E. *Nature* 1991, 352, 139.
10. Maissel, L. I.; Glang, R. (Eds.) "Handbook of Thin Film Technology:, MacGraw Hill: New York: 1970.
11. Bunshah, R. F. (Ed.) "Deposition Technologies for Films and Coatings", Noyes Publications: New Jersey, 1982.

What is claimed is:

1. A process for producing higher fullerenes comprising the steps of:

bombarding a carbon target with a sufficient amount of ions to sputter carbon atoms from said target to form a vapor of sputtered carbon atoms;

maintaining an atmosphere of inert gas into which said carbon atoms are sputtered to form said vapor of sputtered carbon atoms, said vapor of sputtered atoms being maintained at a pressure of between about 0.5 to 10 Torr;

depositing said sputtered carbon atoms onto a substrate to form a carbon soot which contains higher fullerenes and $C_{60}$ wherein the ratio of said higher fullerenes to $C_{60}$ is high; and separating said higher fullerenes from said carbon soot.

2. A process for producing higher fullerenes according to claim 1 wherein said carbon target consists essentially of graphite.

3. A process for producing higher fullerenes according to claim 1 wherein the inert gas atmosphere into which said carbon atoms are sputtered consists essentially of helium and wherein said carbon target is bombarded with positively charged helium ions.

4. A process for producing higher fullerenes according to claim 1 wherein the step of depositing said sputtered carbon atoms comprises the steps of:

entraining at least a portion of said vapor of sputtered carbon atoms in a stream of inert gas; and directing said stream of inert gas onto a chilled deposition substrate wherein said sputtered carbon atoms are deposited as said carbon soot.

5. A process for producing higher fullerenes according to claim 1 wherein said step of separating said higher fullerenes from said carbon soot comprises the steps of:

removing at least a portion of said carbon soot from said substrate; and extracting said higher fullerenes from said carbon soot removed from said substrate by treating said removed soot with a solvent in which one or more of said fullerenes are soluble.

6. A process for producing higher fullerenes according to claim 5 wherein said solvent is selected from the group consisting of pentane, hexane, heptane, octane, benzene, toluene, xylene, carbon disulfide, carbon tetrachloride, pyridine, quinoline and trichloroethane and mixtures thereof.

7. A process for producing higher fullerenes according to claim 6 wherein said solvent is toluene.

8. A process for producing higher fullerenes according to claim 1 wherein said step of bombarding said carbon target with positive ions comprises magnetron sputtering of said carbon target.

9. A process for producing higher fullerenes according to claim 1 wherein said sputtered carbon atoms are deposited on a plurality of substrates which are located in spaced relation with respect to each other and with respect to said carbon target.

10. A system for producing higher fullerenes by sputter-deposition, said system comprising:

a sputtering vessel which includes walls defining a sputter-deposition zone;

a carbon target located within said sputter-deposition zone;

means for bombarding said carbon target with a sufficient amount of ions to sputter carbon atoms from said target to form a vapor of sputtered carbon atoms within said sputter-deposition zone;

means for maintaining an atmosphere of inert gas in said sputter-deposition zone at a pressure of between about 0.5 Torr and 10 Torr wherein said carbon atoms are sputtered into said zone to form said vapor of sputtered carbon atoms;

at least one substrate located within said sputter-deposition zone onto which said sputtered carbon atoms are deposited to form carbon soot which contains fullerenes wherein the ratio of higher fullerenes to $C_{60}$ is high; and means for separating said higher fullerenes from said carbon soot.

11. A system for producing higher fullerenes by sputter-deposition according to claim 10 wherein said carbon target consists essentially of graphite.

12. A system for producing higher fullerenes by sputter-deposition according to claim 10 wherein said means for bombarding said carbon target comprises means for magnetron sputtering of said carbon target.

13. A system for producing higher fullerenes by sputter-deposition according to claim 10 wherein said system further comprises:

means for entraining at least a portion of said vapor of sputtered carbon atoms in a stream of inert gas; and means for directing said stream of inert gas onto a chilled deposition substrate wherein said sputtered carbon atoms are deposited on said substrate as said carbon soot.

14. A system for producing higher fullerenes by sputter-deposition according to claim 10 wherein said means for separation said higher fullerenes from said carbon soot comprises:

means for removing at least a portion of said carbon soot from said substrate; and means for extracting said higher fullerenes from said carbon soot removed from said substrate by treating said removed soot with a solvent in which one or more of said higher fullerenes are soluble.

* * * * *

UNITED STATES PATENT AND TRADEMARK OFFICE
CERTIFICATE OF CORRECTION

PATENT NO. : 5,494,558  
APPLICATION NO. : 08/346549  
DATED : February 27, 1996  
INVENTOR(S) : Rointan F. Bunshah et al.

Page 1 of 1

It is certified that error appears in the above-identified patent and that said Letters Patent is hereby corrected as shown below:

Column 1, line 4, "08/929,637" should read --07/929,637--.

Signed and Sealed this

Twenty-eighth Day of July, 2009

JOHN DOLL  
*Acting Director of the United States Patent and Trademark Office*